United States Patent
Liu et al.

(10) Patent No.: US 7,924,197 B1
(45) Date of Patent: Apr. 12, 2011

(54) METHOD FOR REDUCING CURRENT CONSUMPTION OF DIGITAL-TO-ANALOG CONVERSION, AND ASSOCIATED TRI-STATE CURRENT DIGITAL-TO-ANALOG CONVERTER

(75) Inventors: Chang-Shun Liu, Taipei (TW); Tse-Chi Lin, Taipei County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 10 days.

(21) Appl. No.: 12/611,935

(22) Filed: Nov. 4, 2009

(51) Int. Cl.
*H03M 1/66* (2006.01)
(52) U.S. Cl. ........................................ 341/144; 341/136
(58) Field of Classification Search .................. 341/136, 341/144
See application file for complete search history.

(56) References Cited

U.S. PATENT DOCUMENTS

| | | | |
|---|---|---|---|
| 6,509,855 B1 * | 1/2003 | Cable | 341/144 |
| 7,474,243 B1 * | 1/2009 | Kuttner | 341/144 |

* cited by examiner

*Primary Examiner* — Khai M Nguyen
(74) *Attorney, Agent, or Firm* — Winston Hsu; Scott Margo

(57) ABSTRACT

A method for reducing current consumption of digital-to-analog conversion includes: monitoring logical states of a set of differential digital inputs, wherein the set of differential digital inputs are utilized for controlling at least one tri-state current Digital-to-Analog Converter (DAC) cell of a tri-state current DAC, and the tri-state current DAC cell has a positive output current state, a zero output current state and a negative output current state; and when the logical states of the set of differential digital inputs instruct the tri-state current DAC cell should output no positive/negative current, controlling the tri-state current DAC cell to switch to the zero output current state, temporarily decreasing a direct current passing through a middle path of the tri-state current DAC cell. An associated tri-state current DAC is also provided, where the tri-state current DAC includes: the at least one tri-state current DAC cell; and a control device.

20 Claims, 10 Drawing Sheets

| $D_{IN}+,D_{IN}-$ | GPP | GPN | ENP |
|---|---|---|---|
| 1,0 | 0 | 1 | 1 |
| 0,1 | 1 | 0 | 1 |
| 0,0 | 1 | 1 | ENP(0) |

| $D_{IN}+,D_{IN}-$ | GNP | GNN | ENN |
|---|---|---|---|
| 1,0 | 1 | 0 | 0 |
| 0,1 | 0 | 1 | 0 |
| 0,0 | 0 | 0 | ENN(1) |

US 7,924,197 B1

METHOD FOR REDUCING CURRENT CONSUMPTION OF DIGITAL-TO-ANALOG CONVERSION, AND ASSOCIATED TRI-STATE CURRENT DIGITAL-TO-ANALOG CONVERTER

BACKGROUND

The present invention relates to power consumption of current Digital-to-Analog Converters (DACs), and more particularly, to a method for reducing current consumption of digital-to-analog conversion, and to an associated tri-state current DAC.

Current DACs are widely applied in many technical fields. In a conventional current DAC of a specific type, such as the so-called tri-state current DAC, a specific amount of overall current consumption continuously exists no matter whether the digital values input into the tri-state current DAC are large or small. More specifically, even if the digital values input into the tri-state current DAC are small enough to indicate that the tri-state current DAC should output no current, the specific amount of the overall current consumption continuously exists. As a result, the power is wasted since the tri-state current DAC that outputs no current still sink currents internally. A novel method is therefore required for reducing current consumption of digital-to-analog conversion.

SUMMARY

It is therefore an objective of the claimed invention to provide a method for reducing current consumption of digital-to-analog conversion, and to provide an associated tri-state current Digital-to-Analog Converter (DAC), in order to solve the above-mentioned problem.

An exemplary embodiment of a method for reducing current consumption of digital-to-analog conversion comprises: monitoring logical states of a set of differential digital inputs, wherein the set of differential digital inputs are utilized for controlling at least one tri-state current DAC cell of a tri-state current DAC, and the tri-state current DAC cell has a positive output current state, a zero output current state and a negative output current state; and when the logical states of the set of differential digital inputs instruct the tri-state current DAC cell to switch to the zero output current state, temporarily decreasing a direct current passing through a middle path of the tri-state current DAC cell.

An exemplary embodiment of an associated tri-state current DAC comprises: at least one tri-state current DAC cell, wherein the tri-state current DAC cell has a positive output current state, a zero output current state and a negative output current state; and a control device. The control device is arranged to monitor logical states of a set of differential digital inputs that are utilized for controlling the at least one tri-state current DAC cell. In addition, when the logical states of the set of differential digital inputs instruct the tri-state current DAC cell to switch to the zero output current state, the control device temporarily decreases a direct current passing through a middle path of the tri-state current DAC cell.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
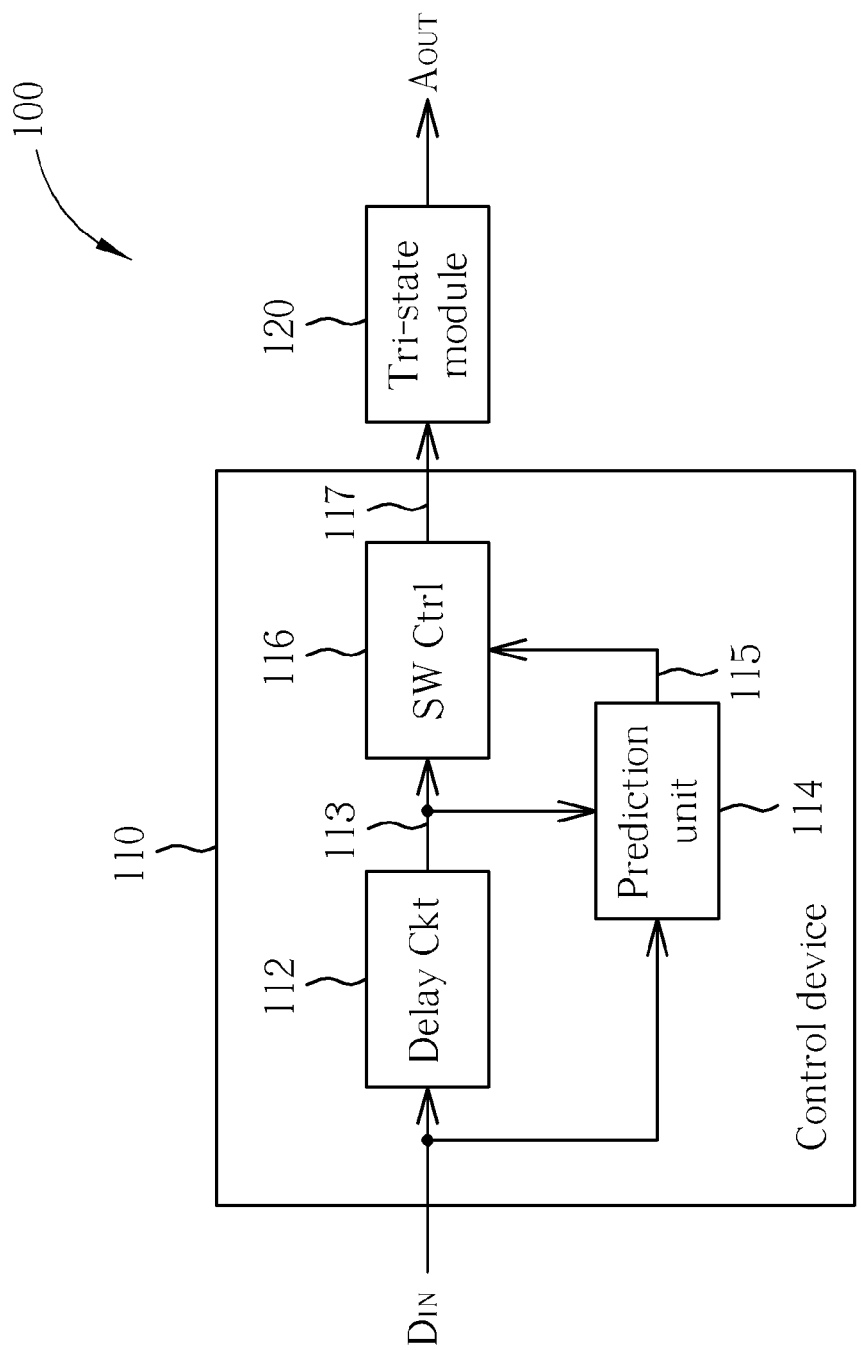
FIG. 1 is a diagram of an apparatus for reducing current consumption of digital-to-analog conversion according to a first embodiment of the present invention.

FIG. 1 is a diagram of an apparatus 100 for reducing current consumption of digital-to-analog conversion according to a first embodiment of the present invention. The apparatus 100 comprises a control device 110 and a tri-state module 120, where the control device 110 comprises a delay circuit 112 (labeled "Delay Ckt" in FIG. 1), a prediction unit 114, and a switching control unit 116 (labeled "SW Ctrl" in FIG. 1). In this embodiment, the tri-state module 120 may comprise at least one tri-state current Digital-to-Analog Converter (DAC) cell of a tri-state current DAC, where the tri-state current DAC cell has a positive output current state, a zero output current state and a negative output current state. This is for illustrative purposes only, and is not meant to be a limitation of the present invention. According to a special case of this embodiment, the tri-state module 120 may comprise a plurality of tri-state current DAC cells of the tri-state current DAC, where each of the tri-state current DAC cells has a positive output current state, a zero output current state and a negative output current state. According to another special case of this embodiment, in a situation where the plurality of tri-state current DAC cells represents all tri-state current DAC cells of the tri-state current DAC, the tri-state module 120 may represent the whole tri-state current DAC.

More particularly, according to an aspect of this and the following embodiments, the apparatus 100 may represent the whole tri-state current DAC, where the tri-state module 120 may represent the plurality of tri-state current DAC cells, and the control device 110 is embedded in the tri-state current DAC.

The positive output current state, the zero output current state and the negative output current state of the aforementioned at least one tri-state current DAC cell (e.g. the tri-state current DAC cell of the first embodiment, or each of the plurality of tri-state current DAC cells mentioned above) are explained as follows. In the positive output current state, the tri-state current DAC cell outputs a positive output current, i.e. a current of a positive current value. In addition, in the negative output current state, the tri-state current DAC cell outputs a negative output current, i.e. a current of a negative current value, which means that the tri-state current DAC cell sinks a current. Additionally, in the zero output current state, the tri-state current DAC cell outputs no current or outputs a current of a current value almost equivalent to zero, or outputs a current of a relatively ignorable value.

In practice, the delay circuit 112 can be implemented with D-type Flip-Flops. This is for illustrative purposes only, and is not meant to be a limitation of the present invention. According to a variation of this embodiment, the delay circuit 112 can be implemented with an inverter chain comprising a plurality of inverters. In addition, the prediction unit 114 and the switching control unit 116 of this embodiment can be implemented with hardware circuits such as logic gates. This is for illustrative purposes only, and is not meant to be a limitation of the present invention. According to some variations of this embodiment, the prediction unit 114 and/or the switching control unit 116 can be implemented with processing circuits executing program code.

According to this embodiment, the control device 110 is arranged to monitor logical states of a set of differential digital inputs that are utilized for controlling the aforementioned at least one tri-state current DAC cell. Here, the notation $D_{IN}$ shown in FIG. 1 is utilized for representing the set of differential digital inputs mentioned above, and the notation $A_{OUT}$ shown in FIG. 1 is utilized for representing an overall output of the aforementioned at least one tri-state current DAC cell. In a situation where the tri-state current DAC cell is in the zero output current state, the control device is capable of properly controlling the tri-state current DAC cell to save the power of the zero output current state. More particularly, the delay circuit 112 is arranged to delay timing of the set of differential digital inputs, and the prediction unit 114 is arranged to generate a prediction result 115 according to the delayed set of differential digital inputs and according to the set of differential digital inputs when the tri-state current DAC cell is in the zero output current state, where the prediction result 115 indicates occurrence of the zero output current state. Here, the numeral 113 represents the delayed version of the set of differential digital inputs, i.e. the aforementioned delayed set of differential digital inputs. In addition, the switching control unit 116 is arranged to perform switching control on the tri-state current DAC cell according to the prediction result 115 when the tri-state current DAC cell is in the zero output current state, where the switching control unit 116 controls the tri-state current DAC cell within the tri-state module 120 through at least one control signal 117. Please refer to FIG. 2 for further details of operations of the apparatus 100.

Figure 2:
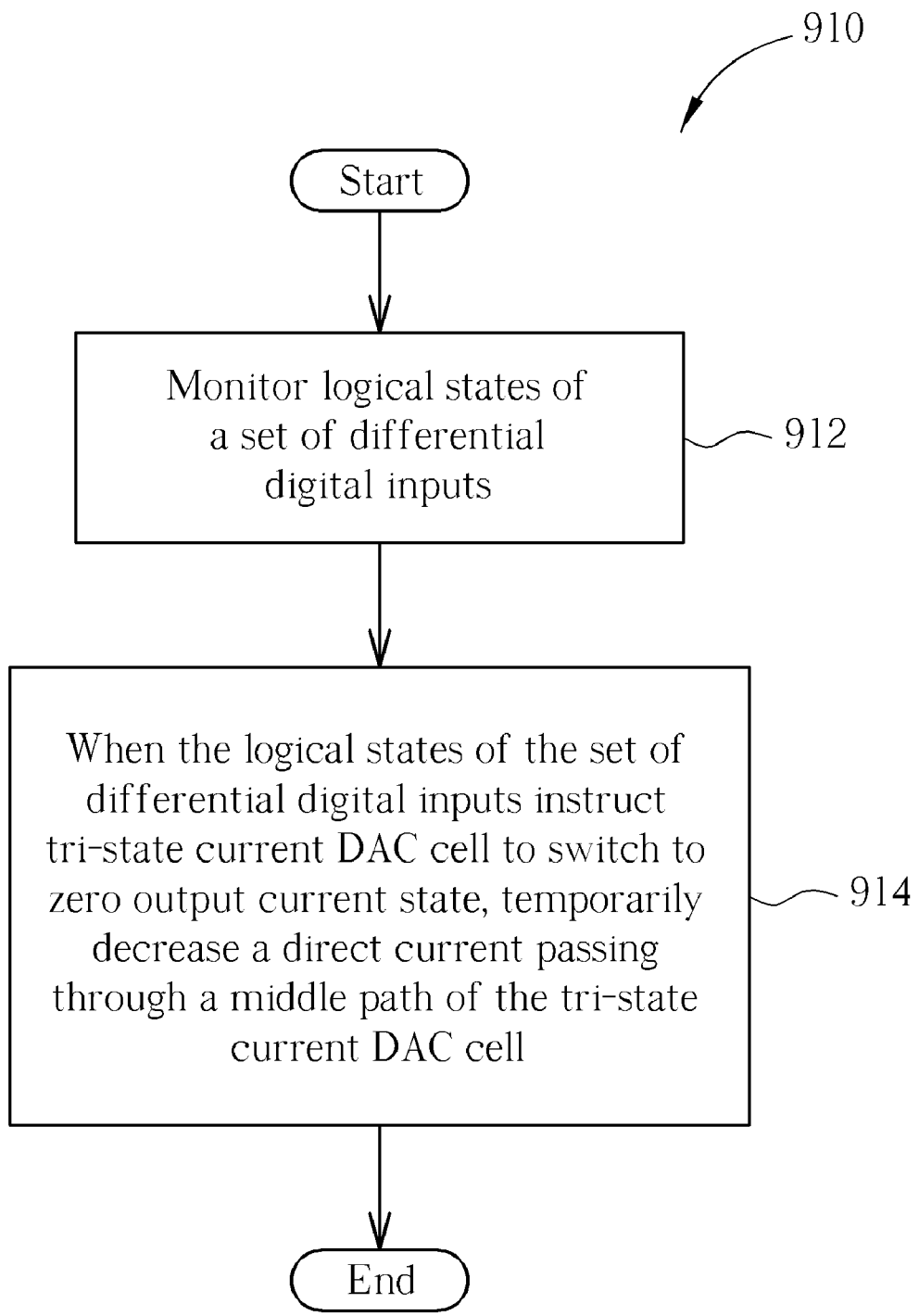
FIG. 2 is a flowchart of a method for reducing current consumption of digital-to-analog conversion according to one embodiment of the present invention.

FIG. 2 is a flowchart of a method 910 for reducing current consumption of digital-to-analog conversion according to one embodiment of the present invention. The method shown in FIG. 2 can be applied to the apparatus 100 shown in FIG. 1, and more particularly, the control device 110 therein. In addition, the method shown in FIG. 2 can be implemented by utilizing the apparatus 100 shown in FIG. 1, and more particularly, the control device 110 therein. The method is described as follows.

In Step 912, the control device 110 monitors logical states of a set of differential digital inputs (e.g. the set of differential digital inputs mentioned above), wherein the set of differential digital inputs are utilized for controlling at least one tri-state current DAC cell of a tri-state current DAC, such as the aforementioned at least one tri-state current DAC cell.

In Step 914, when the logical states of the set of differential digital inputs instruct the tri-state current DAC cell to switch to the zero output current state, the control device 110 temporarily decreases a direct current passing through a middle path of the tri-state current DAC cell (by controlling the tri-state current DAC cell using the switching control unit 116), where the middle path of the tri-state current DAC cell passes through an associated common mode node, and a common mode voltage is applied to the middle path of the tri-state current DAC cell.

According to this embodiment, the working flow shown in FIG. 2 can be repeatedly performed. In addition, according to a special case of this embodiment, such as that in which the tri-state module 120 comprises the plurality of tri-state current DAC cells, the working flow shown in FIG. 2 can be respectively applied to each of these tri-state current DAC cells. In a situation where the set of differential digital inputs are utilized for controlling the plurality of tri-state current DAC cells, when the logical states of the set of differential digital inputs instruct one or more tri-state current DAC cells to switch to the zero output current state, the control device temporarily decreases a direct current passing through a middle path of each of the one or more tri-state current DAC cells. As a result, the power of the one or more tri-state current DAC cells in the zero output current state can be saved.

Figure 3A:
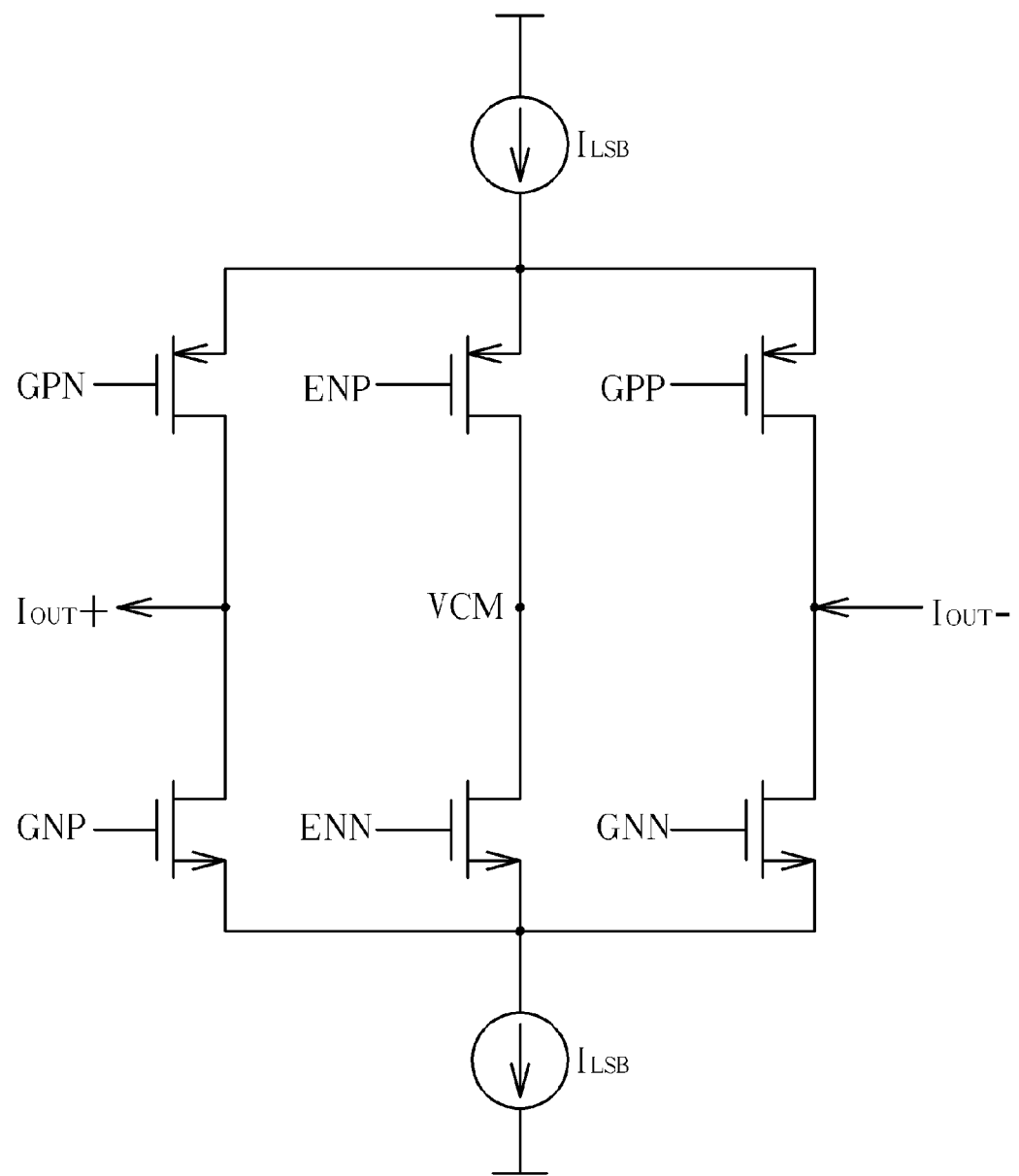
FIG. 3A illustrates a tri-state current Digital-to-Analog Converter (DAC) cell involved with the method shown in FIG. 2 according to an embodiment of the present invention.
Figure 3B:
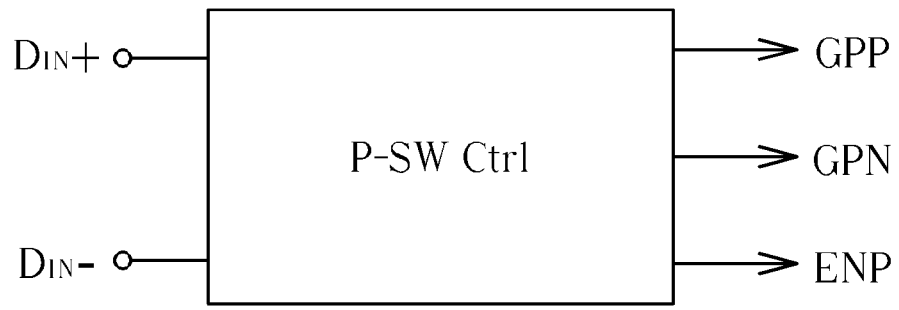
FIGS. 3B-3C illustrate switching control strategies for the tri-state current DAC cell shown in FIG. 3A.
Figure 3C:
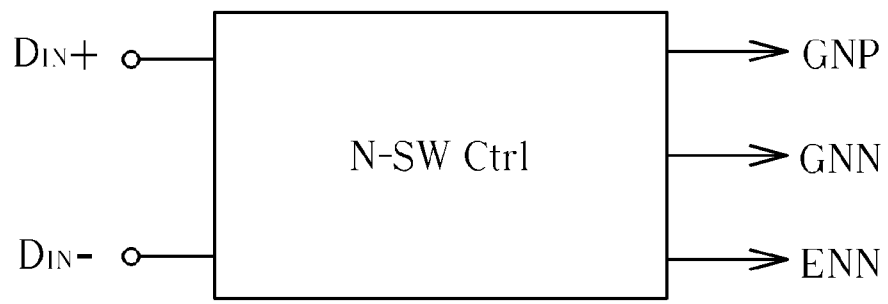

Please refer to FIGS. 3A-3C. FIG. 3A illustrates the tri-state current DAC cell involved with the method 910 shown in FIG. 2 according to an embodiment of the present invention, and FIGS. 3B-3C illustrate switching control strategies for the tri-state current DAC cell shown in FIG. 3A. The tri-state current DAC cell shown in FIG. 3A comprises two current sources (labeled "$I_{LSB}$" in FIG. 3A) and six switches that are implemented with Metal Oxide Semiconductor Field Effect Transistors (MOSFETs) in this embodiment. The aforementioned at least one control signal 117 comprises a plurality of control signals GPP, GPN, ENP, GNP, GNN, and ENN, which are respectively input into the control terminals of these switches. The notation $I_{OUT}-$ represents a negative output current, and the notation $I_{OUT}+$ represents a positive output current, while the notation VCM represents the common mode node mentioned above.

In addition, the switching control unit 116 comprises the P-switch control unit shown in FIG. 3B (labeled "P-SW Ctrl", which means the control unit for positive-type switches), where the corresponding switching control strategies are listed with the table shown in the lower half of FIG. 3B. The notations $D_{IN}+$ and $D_{IN}-$ represent the set of differential digital inputs for controlling the tri-state current DAC cell shown in FIG. 3A. In the first column of this table, the logical states of the set of differential digital inputs $D_{IN}+$ and $D_{IN}-$ are listed by different combinations thereof. In the other columns of this table, the logical states 0 and 1 of the control signals GPP, GPN, and ENP respectively represent a low voltage level and a high voltage level in this embodiment, where the logical state 0 of the control signal ENP corresponds to a predetermined waveform ENP(0).

Additionally, the switching control unit 116 further comprises the N-switch control unit shown in FIG. 3C (labeled "N-SW Ctrl", which means the control unit for negative-type switches), where the corresponding switching control strategies are listed with the table shown in the lower half of FIG.

3C. Similarly, in the first column of this table, the logical states of the set of differential digital inputs $D_{IN}+$ and $D_{IN}-$ are listed by different combinations thereof. In the other columns of this table, the logical states 0 and 1 of the control signals GNP, GNN, and ENN respectively represent the low voltage level and the high voltage level in this embodiment, where the logical state 1 of the control signal ENN corresponds to a predetermined waveform ENN(1).

As a result, the tri-state current DAC cell shown in FIG. 3A may output the positive output current $I_{OUT}+$ to represent a first predetermined state (e.g. the positive output current state), or output the negative output current $I_{OUT}-$ to represent a second predetermined state (e.g. the negative output current state), or output no current or output a current of a current value almost equivalent to zero (or output a current of a relatively ignorable value) to represent a third predetermined state (e.g. the zero output current state), based upon the logical states of the set of differential digital inputs $D_{IN}+$ and $D_{IN}-$.

Figure 4:
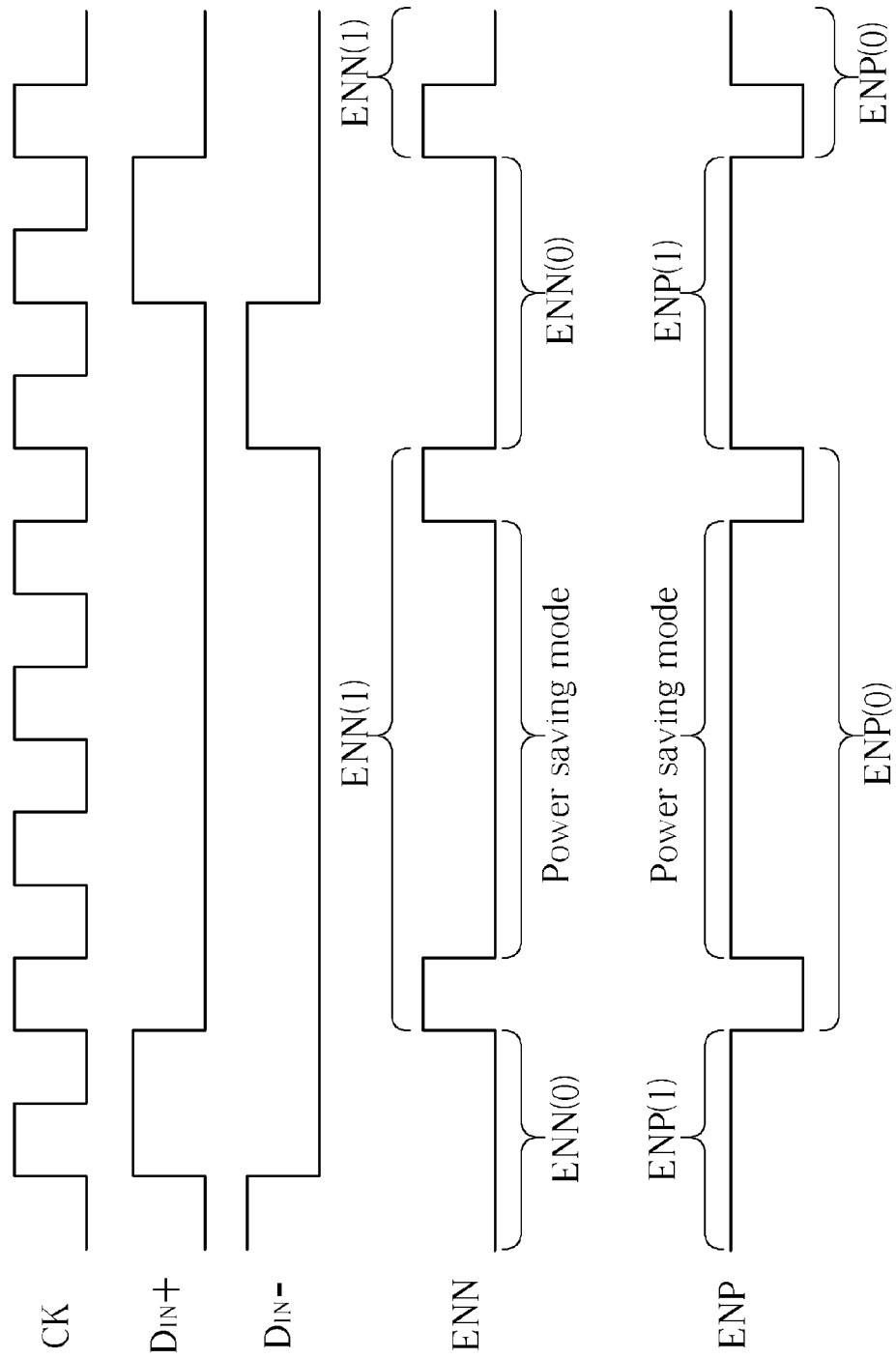
FIG. 4 illustrates a timing chart of related signals of the embodiment shown in FIG. 3A.

Please refer to FIG. 4 for better comprehension. FIG. 4 illustrates a timing chart of related signals of the embodiment shown in FIG. 3A. Please note that when the logical states of the set of differential digital inputs $D_{IN}+$ and $D_{IN}-$ are both zero (e.g. both the differential digital inputs $D_{IN}+$ and $D_{IN}-$ are at the low voltage level thereof), the tri-state current DAC cell shown in FIG. 3A is in the zero output current state mentioned above based upon the switching control strategies illustrated in FIGS. 3B-3C. The shaded portion in the predetermined waveform ENN(1) represent the power saved in the power saving mode for the logical state 1 of the control signal ENN, where the logical state 0 of the control signal ENN corresponds to a normal waveform ENN(0). In addition, the shaded portion in the predetermined waveform ENP(0) represent the power saved in the power saving mode for the logical state 0 of the control signal ENP, where the logical state 1 of the control signal ENP corresponds to a normal waveform ENP(1).

As a result of the architecture and associated operations disclosed in FIGS. 3A-3C and FIG. 4, when the tri-state current DAC cell shown in FIG. 3A is in the zero output current state, the control device 110 prevents the switches of the middle path of the tri-state current DAC cell shown in FIG. 3A (i.e. the middle path that passes through the common mode node VCM) from being turned on during an intermediate portion of the whole time interval corresponding to the zero output current state, in order to reduce current consumption of the zero output current state. For example, the whole time interval may represent the whole interval of any of the predetermined waveforms ENP(0) or ENN(1). In another example, the intermediate portion may represent the interval indicated by any shaded portion shown in FIG. 4.

More particularly, during a beginning portion of the whole time interval corresponding to the zero output current state, the control device 110 temporarily turns on the switches and then temporarily turns off the switches, as illustrated with the beginning portion of any of the predetermined waveforms ENP(0) or ENN(1). For example, the beginning portion of the whole time interval is arranged to be a time period that is equivalent to a predetermined ratio of a clock period of the clock signal CK, such as a half of the clock period. In addition, during an end portion of the whole time interval corresponding to the zero output current state, the control device 110 temporarily turns on the switches and then temporarily turns off the switches, as illustrated with the end portion of any of the predetermined waveforms ENP(0) or ENN(1). For example, the end portion of the whole time interval is arranged to be a time period that is equivalent to a predetermined ratio of the clock period of the clock signal CK, such as a half of the clock period.

According to this embodiment, the control device 110 provides proper control in the beginning portion of the whole time interval corresponding to the zero output current state, in order to ensure the tri-state current DAC cell shown in FIG. 3A properly enter the zero output current state. In addition, the control device 110 provides proper control in the end portion of the whole time interval corresponding to the zero output current state, in order to pre-charge respective drain voltages of the MOSFETs and ensure the correctness of the normal waveforms ENN(0) and ENP(1). Therefore, abnormal operations of the tri-state current DAC cell shown in FIG. 3A will never occur while the power saving mode is applied to the architecture shown in FIG. 3A.

Figure 5:
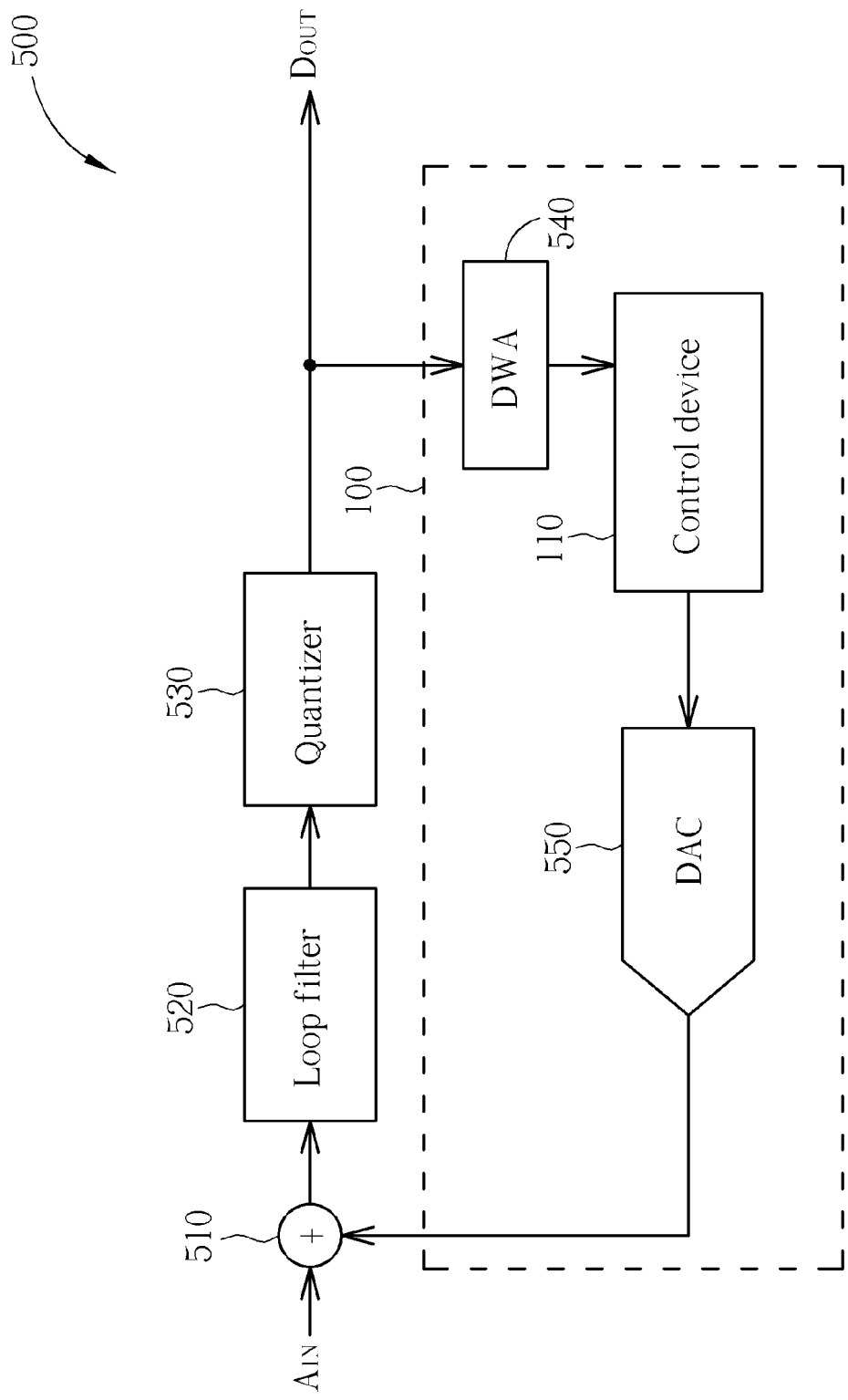
FIG. 5 is a diagram of an apparatus for reducing current consumption of digital-to-analog conversion according to a second embodiment of the present invention.

FIG. 5 is a diagram of an apparatus 500 for reducing current consumption of digital-to-analog conversion according to a second embodiment of the present invention. In addition to the control device 110 mentioned above, the apparatus 500 further comprises an adder 510, a loop filter 520, a quantizer 530, a data weighted averaging (DWA) unit 540 (labeled "DWA" in FIG. 5), and a DAC 550, where the DAC 550 comprises all the tri-state current DAC cells of the tri-state current DAC mentioned above, and more particularly, represents the tri-state current DAC. Here, the notations $A_{IN}$ and $D_{OUT}$ represent an analog input and a digital output of the architecture shown in FIG. 5, and the adder 510 receives the analog input $A_{IN}$ and injects the feedback from the feedback path (i.e. the lower half of this architecture) into the main path (i.e. the upper half of this architecture). In addition, the loop filter 520 performs loop filtering on the main path, and the quantizer 530 quantizes the filtered result from the loop filter 520 to generate the digital output $D_{OUT}$. Additionally, the lower half of this architecture can be implemented by embedding the DWA unit 540 into the apparatus 100 with the tri-state module 120 representing the whole tri-state current DAC mentioned above (as in the aforementioned special case in which the plurality of tri-state current DAC cells represents all the tri-state current DAC cells of the tri-state current DAC), where the DWA unit 540 can operate according to a DWA algorithm. Similar descriptions regarding the lower half of this architecture are not repeated in detail for this embodiment.

According to a variation of this embodiment, the switching control unit 116 can be embedded into the DAC 550. According to another variation of this embodiment, at least the delay circuit 112, the prediction unit 114, and the switching control unit 116 can be embedded into the DAC 550.

Figure 6A:
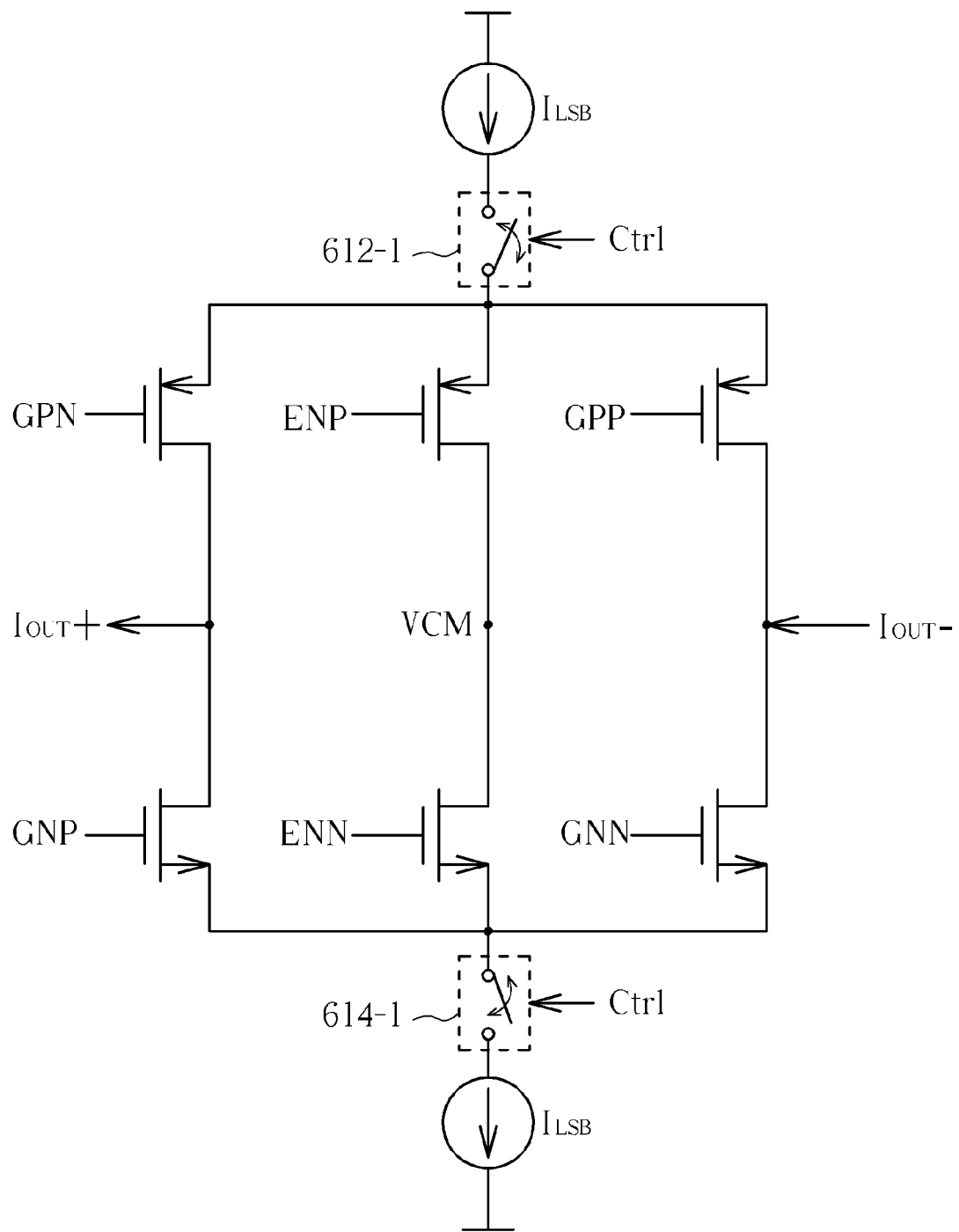
FIG. 6A illustrates a tri-state current DAC cell involved with the method shown in FIG. 2 according to another embodiment of the present invention.

FIG. 6A illustrates the tri-state current DAC cell involved with the method 910 shown in FIG. 2 according to another embodiment of the present invention. This architecture can be implemented by embedding additional switches 612-1 and 614-1 into the tri-state current DAC cell shown in FIG. 3A. In order to carry out the power saving mode mentioned above, the switches 612-1 and 614-1 are utilized for temporarily disconnecting the input/output terminals of the current sources (labeled "$I_{LSB}$" in FIG. 6A) from the other portions of this architecture, such as the aforementioned middle path and side paths from which the negative output current $I_{OUT}-$ and the positive output current $I_{OUT}+$ are respectively output. This is for illustrative purposes only, and is not meant to be a limitation of the present invention. According to variations of this embodiment, at least one of the additional switches 612-1 and 614-1 is arranged to be positioned between the associated current source and its driving voltage. More particularly, in one of these variations, such as that shown in FIG. 6B, each of the two additional switches is positioned between the associated current source and its driving voltage, where in response to the change in architecture, the two additional switches are referred to as the additional switches 612-2 and 614-2. Similar descriptions are not repeated in detail for these variations.

According to this embodiment, the associated switching control strategies are almost the same as those shown in FIGS. 3B-3C. More specifically, the notation ENP(0) in the table shown in FIG. 3B and the notation ENN(1) in the table shown in FIG. 3C are replaced by "0" and "1", respectively. That is, the predetermined waveforms ENP(0) and ENN(1) are replaced by normal waveforms having no transitions for the power saving mode. In this embodiment, the normal waveforms of the control signals ENN and ENP in the whole time interval corresponding to the zero output current state are the aforementioned high voltage level and the aforementioned low voltage level, respectively.

Figure 7:
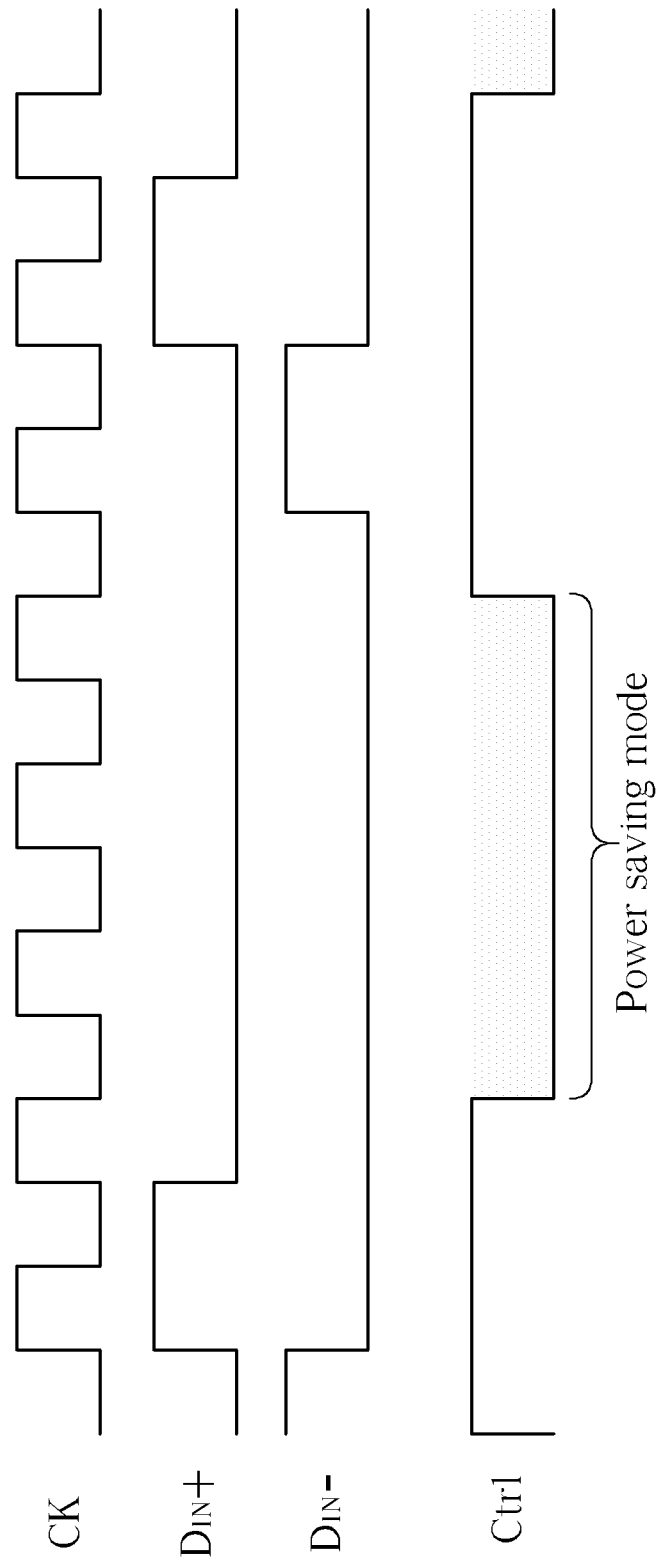
FIG. 7 illustrates a timing chart of related signals of the embodiment shown in FIG. 6A.

FIG. 7 illustrates a timing chart of related signals of the embodiment shown in FIG. 6A. When the logical states of the set of differential digital inputs $D_{IN}+$ and $D_{IN}-$ are both zero (e.g. both the differential digital inputs $D_{IN}+$ and $D_{IN}-$ are at the low voltage level thereof), the tri-state current DAC cell shown in FIG. 6A is in the zero output current state.

As a result of the architecture and associated operations disclosed in FIG. 6A and FIG. 7, when the tri-state current DAC cell shown in FIG. 6A is in the zero output current state mentioned above, the control device 110 prevents the additional switches 612-1 and 614-1 respectively connected to the associated current sources of the tri-state current DAC cell shown in FIG. 6A from being turned on during the intermediate portion of the whole time interval corresponding to the zero output current state, in order to reduce current consumption of the zero output current state. Here, the whole time interval corresponding to the zero output current state in this embodiment is the same as that of the embodiment disclosed in FIGS. 3A-3C and FIG. 4, and the intermediate portion of the whole time interval corresponding to the zero output current state in this embodiment is the same as that of the embodiment disclosed in FIGS. 3A-3C and FIG. 4. Similar descriptions are not repeated in detail for this embodiment.

Figure 6B:
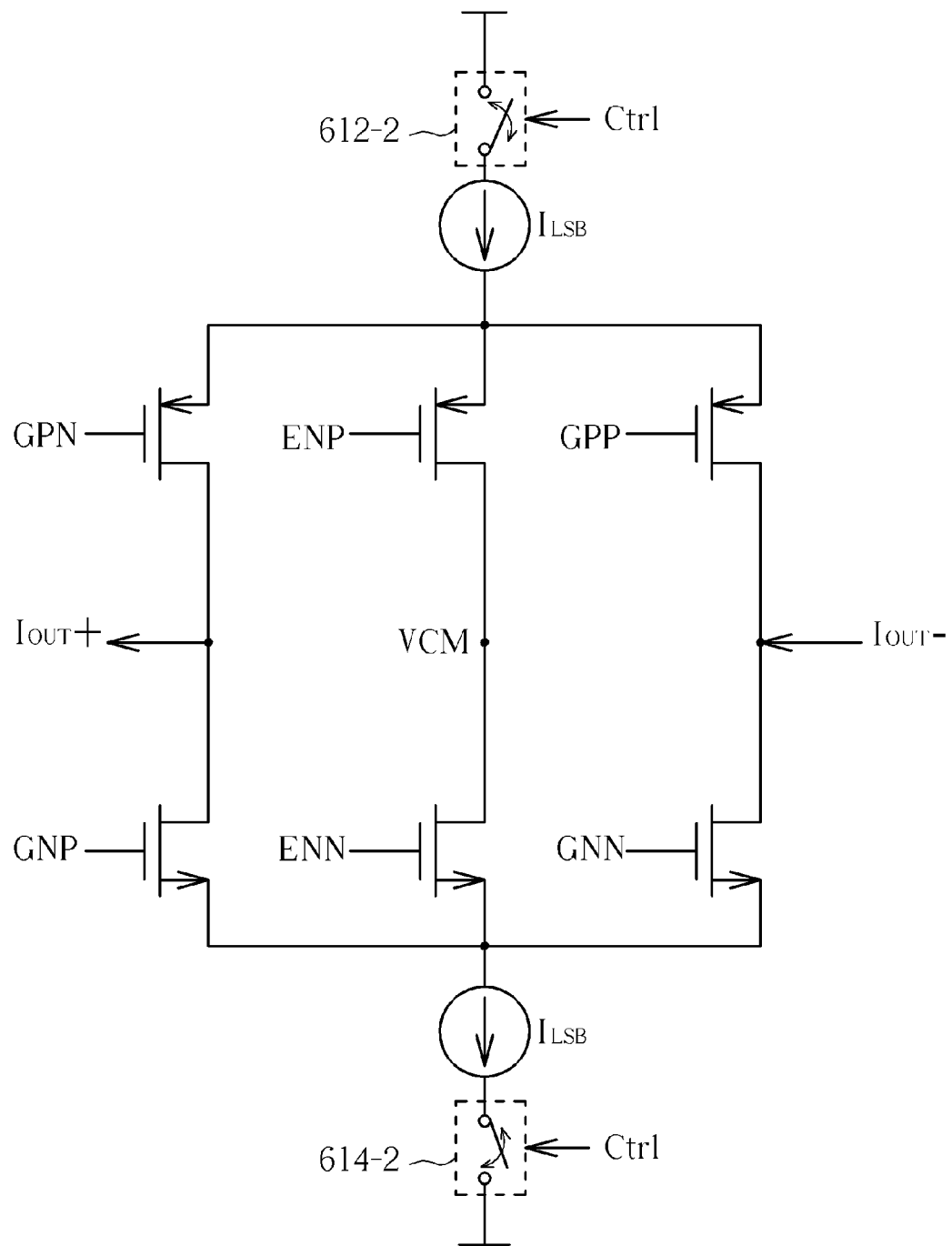
FIG. 6B illustrates a tri-state current DAC cell involved with the method shown in FIG. 2 according to a variation of the embodiment shown in FIG. 6A.

Please note that the above descriptions regarding the timing chart shown in FIG. 7 can be applied to the aforementioned variations of the embodiment shown in FIG. 6A, such as that shown in FIG. 6B. Therefore, similar descriptions are not repeated in detail for these variations.

It is an advantage of the embodiments that the method and the associated tri-state current DAC can save the power in the power saving mode mentioned above. As a result, in a situation where the tri-state current DAC is utilized for implementing some portable devices, the low power requirements of the portable devices can be satisfied with ease.

It is another advantage of the embodiments that, by providing proper control in the beginning and the end portions of the whole time interval corresponding to the zero output current state, the method and associated tri-state current DAC can maintain the overall performance while the power saving mode is implemented.

Those skilled in the art will readily observe that numerous modifications and alterations of the device and method may be made while retaining the teachings of the invention.

What is claimed is:

1. A method for reducing current consumption of digital-to-analog conversion, the method comprising:
   monitoring logical states of a set of differential digital inputs, wherein the set of differential digital inputs are utilized for controlling at least one tri-state current Digital-to-Analog Converter (DAC) cell of a tri-state current DAC, and the tri-state current DAC cell has a positive output current state, a zero output current state and a negative output current state; and
   when the logical states of the set of differential digital inputs instruct the tri-state current DAC cell to switch to the zero output current state, temporarily decreasing a direct current passing through a middle path of the tri-state current DAC cell.

2. The method of claim 1, wherein a common mode voltage is applied to the middle path of the tri-state current DAC cell.

3. The method of claim 1, wherein when the tri-state current DAC cell is in the zero output current state, the method further comprises:
   preventing switches of the middle path from being turned on during an intermediate portion of a whole time interval corresponding to the zero output current state.

4. The method of claim 3, further comprising:
   during a beginning portion of the whole time interval corresponding to the zero output current state, temporarily turning on the switches and then temporarily turning off the switches.

5. The method of claim 4, wherein the beginning portion of the whole time interval is arranged to be a time period that is equivalent to a predetermined ratio of a clock period.

6. The method of claim 3, further comprising:
   during an end portion of the whole time interval corresponding to the zero output current state, temporarily turning on the switches and then temporarily turning off the switches.

7. The method of claim 6, wherein the end portion of the whole time interval is arranged to be a time period that is equivalent to a predetermined ratio of a clock period.

8. The method of claim 1, wherein when the tri-state current DAC cell is in the zero output current state, the method further comprises:
   preventing at least one switch connected to a current source of the tri-state current DAC cell from being turned on during an intermediate portion of a whole time interval corresponding to the zero output current state.

9. The method of claim 1, wherein a delay circuit is arranged to delay timing of the set of differential digital inputs; and when the tri-state current DAC cell is in the zero output current state, the method further comprises:
   generating a prediction result according to the delayed set of differential digital inputs, wherein the prediction result indicates occurrence of the zero output current state; and
   performing switching control on the tri-state current DAC cell according to the prediction result.

10. The method of claim 1, wherein when the tri-state current DAC cell is in the zero output current state, the method further comprises:
    generating a prediction result according to the set of differential digital inputs, wherein the prediction result indicates occurrence of the zero output current state; and
    performing switching control on the tri-state current DAC cell according to the prediction result.

11. A tri-state current Digital-to-Analog Converter (DAC), comprising:
    at least one tri-state current DAC cell, wherein the tri-state current DAC cell has a positive output current state, a zero output current state and a negative output current state; and
    a control device arranged to monitor logical states of a set of differential digital inputs that are utilized for controlling the at least one tri-state current DAC cell, wherein when the logical states of the set of differential digital inputs instruct the tri-state current DAC cell to switch to the zero output current state, the control device temporarily decreases a direct current passing through a middle path of the tri-state current DAC cell.

12. The tri-state current DAC of claim 11, wherein a common mode voltage is applied to the middle path of the tri-state current DAC cell.

13. The tri-state current DAC of claim 11, wherein when the tri-state current DAC cell is in the zero output current state, the control device prevents switches of the middle path from being turned on during an intermediate portion of a whole time interval corresponding to the zero output current state.

14. The tri-state current DAC of claim 13, wherein during a beginning portion of the whole time interval corresponding to the zero output current state, the control device temporarily turns on the switches and then temporarily turns off the switches.

15. The tri-state current DAC of claim 14, wherein the beginning portion of the whole time interval is arranged to be a time period that is equivalent to a predetermined ratio of a clock period.

16. The tri-state current DAC of claim 13, wherein during an end portion of the whole time interval corresponding to the zero output current state, the control device temporarily turns on the switches and then temporarily turns off the switches.

17. The tri-state current DAC of claim 16, wherein the end portion of the whole time interval is arranged to be a time period that is equivalent to a predetermined ratio of a clock period.

18. The tri-state current DAC of claim 11, wherein when the tri-state current DAC cell is in the zero output current state, the control device prevents at least one switch connected to a current source of the tri-state current DAC cell from being turned on during an intermediate portion of a whole time interval corresponding to the zero output current state, in order to reduce current consumption of the zero output current state.

19. The tri-state current DAC of claim 11, wherein the control device comprises:
   a delay circuit arranged to delay timing of the set of differential digital inputs;
   a prediction unit arranged to generate a prediction result according to the delayed set of differential digital inputs when the tri-state current DAC cell is in the zero output current state, wherein the prediction result indicates occurrence of the zero output current state; and
   a switching control unit arranged to perform switching control on the tri-state current DAC cell according to the prediction result when the tri-state current DAC cell is in the zero output current state.

20. The tri-state current DAC of claim 11, wherein the control device comprises:
   a prediction unit arranged to generate a prediction result according to the set of differential digital inputs when the tri-state current DAC cell is in the zero output current state, wherein the prediction result indicates occurrence of the zero output current state; and
   a switching control unit arranged to perform switching control on the tri-state current DAC cell according to the prediction result when the tri-state current DAC cell is in the zero output current state.

\* \* \* \* \*